(12) United States Patent
Lee et al.

(10) Patent No.: US 11,367,714 B2
(45) Date of Patent: Jun. 21, 2022

(54) SEMICONDUCTOR PACKAGE DEVICE

(71) Applicant: Samsung Electronics Co., Ltd., Suwon-si (KR)

(72) Inventors: Jangwoo Lee, Asan-si (KR); Jongbo Shim, Asan-si (KR); Ji Hwang Kim, Cheonan-si (KR); Yungcheol Kong, Cheonan-si (KR); Youngbae Kim, Seoul (KR); Taehwan Kim, Hwaseong-si (KR); Hyunglak Ma, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/845,567

(22) Filed: Apr. 10, 2020

(65) Prior Publication Data
US 2021/0043612 A1 Feb. 11, 2021

(30) Foreign Application Priority Data

Aug. 5, 2019 (KR) ........................ 10-2019-0095025

(51) Int. Cl.
*H01L 25/10* (2006.01)
*H01L 23/00* (2006.01)
(Continued)

(52) U.S. Cl.
CPC ........ *H01L 25/105* (2013.01); *H01L 23/3107* (2013.01); *H01L 23/3128* (2013.01); *H01L 23/367* (2013.01); *H01L 23/3736* (2013.01); *H01L 23/3738* (2013.01); *H01L 23/562* (2013.01); *H01L 24/46* (2013.01); *H01L 24/97* (2013.01); *H01L 25/50* (2013.01);
(Continued)

(58) Field of Classification Search
CPC ..... H01L 25/105; H01L 23/562; H01L 25/50; H01L 2225/1058; H01L 2225/1041; H01L 24/42; H01L 2225/06568; H01L 25/0657; H01L 2225/0651; H01L 25/18; H01L 23/3107; H01L 23/367; H01L 23/3128; H01L 23/3736; H01L 23/3738; H01L 24/46; H01L 24/97; H01L 2225/06562; H01L 2225/06572
See application file for complete search history.

(56) References Cited

U.S. PATENT DOCUMENTS 8,035,210 B2 10/2011 Yang et al.
8,558,366 B2 10/2013 Choi et al.
(Continued)

FOREIGN PATENT DOCUMENTS

JP 3447051 9/2003
JP 2011061132 3/2011
KR 101933425 12/2018

*Primary Examiner* — Marcos D. Pizarro
(74) *Attorney, Agent, or Firm* — Myers Bigel, P.A.

(57) ABSTRACT

A semiconductor package device may include a first package substrate, a first semiconductor chip on the first package substrate, an interposer on the first semiconductor chip, a warpage prevention member on the interposer, a molding member on the interposer and the first package substrate, and a second package substrate on the molding member. At least a portion of a top surface of the molding member may be spaced apart from a bottom surface of the second package substrate.

20 Claims, 17 Drawing Sheets

(51) Int. Cl.
  *H01L 25/00* (2006.01)
  *H01L 23/31* (2006.01)
  *H01L 23/367* (2006.01)
  *H01L 23/373* (2006.01)

(52) U.S. Cl.
  CPC ............ *H01L 2225/06562* (2013.01); *H01L 2225/06572* (2013.01); *H01L 2225/1041* (2013.01); *H01L 2225/1058* (2013.01)

(56) References Cited

U.S. PATENT DOCUMENTS

| | | | |
|---|---|---|---|
| 8,699,232 B2 | 4/2014 | Choi et al. |
| 8,779,606 B2 | 7/2014 | Yim et al. |
| 8,829,342 B2 | 9/2014 | Compaan et al. |
| 8,829,686 B2 | 9/2014 | Hong et al. |
| 9,059,011 B2 | 6/2015 | Pagaila et al. |
| 9,245,867 B2 | 1/2016 | Yim et al. |
| 9,263,426 B2 | 2/2016 | Zhao et al. |
| 9,355,931 B2 | 5/2016 | Kim et al. |
| 9,502,342 B2 | 11/2016 | Kim |
| 9,748,203 B2 | 8/2017 | Yang et al. |
| 10,002,857 B2 | 6/2018 | Solimando et al. |
| 2007/0114677 A1 | 5/2007 | Kwon et al. |
| 2007/0181991 A1* | 8/2007 | Ishino ................ H01L 25/0657 257/686 |
| 2009/0126982 A1* | 5/2009 | Nakamura ........ H01L 23/49822 174/262 |
| 2010/0103634 A1* | 4/2010 | Funaya ................ H05K 1/185 361/761 |
| 2010/0244212 A1 | 9/2010 | Ha et al. |
| 2016/0079219 A1 | 3/2016 | Hosomi |
| 2017/0154878 A1 | 6/2017 | Kim et al. |
| 2019/0074264 A1 | 3/2019 | Chen et al. |
| 2019/0164893 A1 | 5/2019 | Kim et al. |
| 2019/0198437 A1* | 6/2019 | Kim ................ H01L 23/49833 |
| 2019/0252340 A1* | 8/2019 | Pei ...................... H01L 23/3128 |

\* cited by examiner

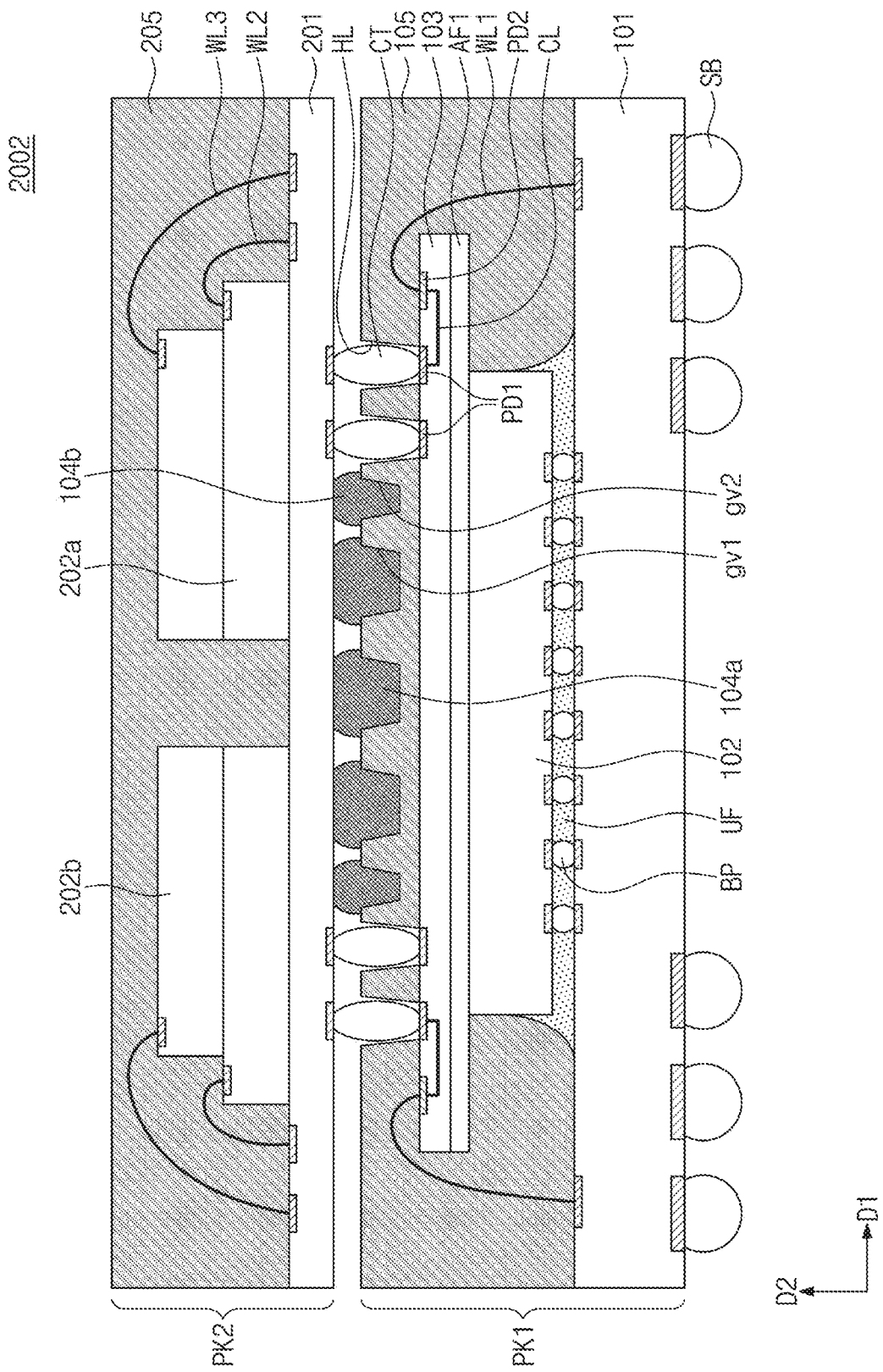

SEMICONDUCTOR PACKAGE DEVICE

CROSS-REFERENCE TO RELATED APPLICATIONS

This U.S. non-provisional patent application claims priority under 35 U.S.C. § 119 to Korean Patent Application No. 10-2019-0095025, filed on Aug. 5, 2019, in the Korean Intellectual Property Office, the entire contents of which are hereby incorporated by reference.

BACKGROUND OF THE INVENTION

The present disclosure relates to semiconductor package devices, and, in particular, to semiconductor package devices including an interposer.

A semiconductor package, in which a semiconductor chip is included, may allow the semiconductor chip to be used as a part of an electronic product. Conventionally, a semiconductor package may include a printed circuit board (PCB) and a semiconductor chip, which is mounted on the PCB and is electrically connected to the PCB using bonding wires or bumps. With development of the electronic industry, many studies are being conducted to improve electrical characteristics and operational reliability of semiconductor packages.

SUMMARY

An embodiment of the inventive concept provides a semiconductor package device configured to suppress a warpage issue and to have an improved thermal property.

According to an embodiment of the inventive concept, a semiconductor package device may include a first package substrate, a first semiconductor chip on the first package substrate, an interposer on the first semiconductor chip, a warpage prevention member on the interposer, a molding member on the interposer and the first package substrate, and a second package substrate on the molding member. At least a portion of a top surface of the molding member may be spaced apart from a bottom surface of the second package substrate.

According to an embodiment of the inventive concept, a semiconductor package device may include a first package substrate, a first semiconductor chip on the first package substrate, an interposer on the first semiconductor chip, a molding member on the interposer, first semiconductor chip, and the first package substrate, a warpage prevention member and a plurality of connection terminals on the interposer, and a second package substrate on the warpage prevention member and in electrical contact with the plurality of connection terminals. At least a portion of a top surface of the molding member may be spaced apart from the second package substrate, and a first thickness of the connection terminals may be greater than a thickness of the warpage prevention member in a direction perpendicular to a top surface of the first package substrate.

According to an embodiment of the inventive concept, a semiconductor package device may include a first package, a second package on the first package, and a plurality of connection terminals electrically connecting the first package to the second package. The first package may include a first package substrate, a first semiconductor chip on the first package substrate, an interposer on the first semiconductor chip, a first adhesive layer interposed between the first semiconductor chip and the interposer, a warpage prevention member on the interposer, a second adhesive layer between the warpage prevention member and the interposer, and a first molding member on the interposer and the first package substrate. The second package may include a second package substrate connected to the plurality of connection terminals, second semiconductor chips on the second package substrate and spaced apart from each other, and a second molding member in a region between the second semiconductor chips and side surfaces of the second semiconductor chips. At least a portion of an upper portion of the first molding member may be spaced apart from the second package substrate, and a top surface of the warpage prevention member may be free of the first molding member. The warpage prevention member may have a thickness in a direction perpendicular to a top surface of the first package substrate and a thermal expansion coefficient that are greater than those of the interposer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 6B is a sectional view of the semiconductor package device shown in FIG. 6A.

Figure 1A:
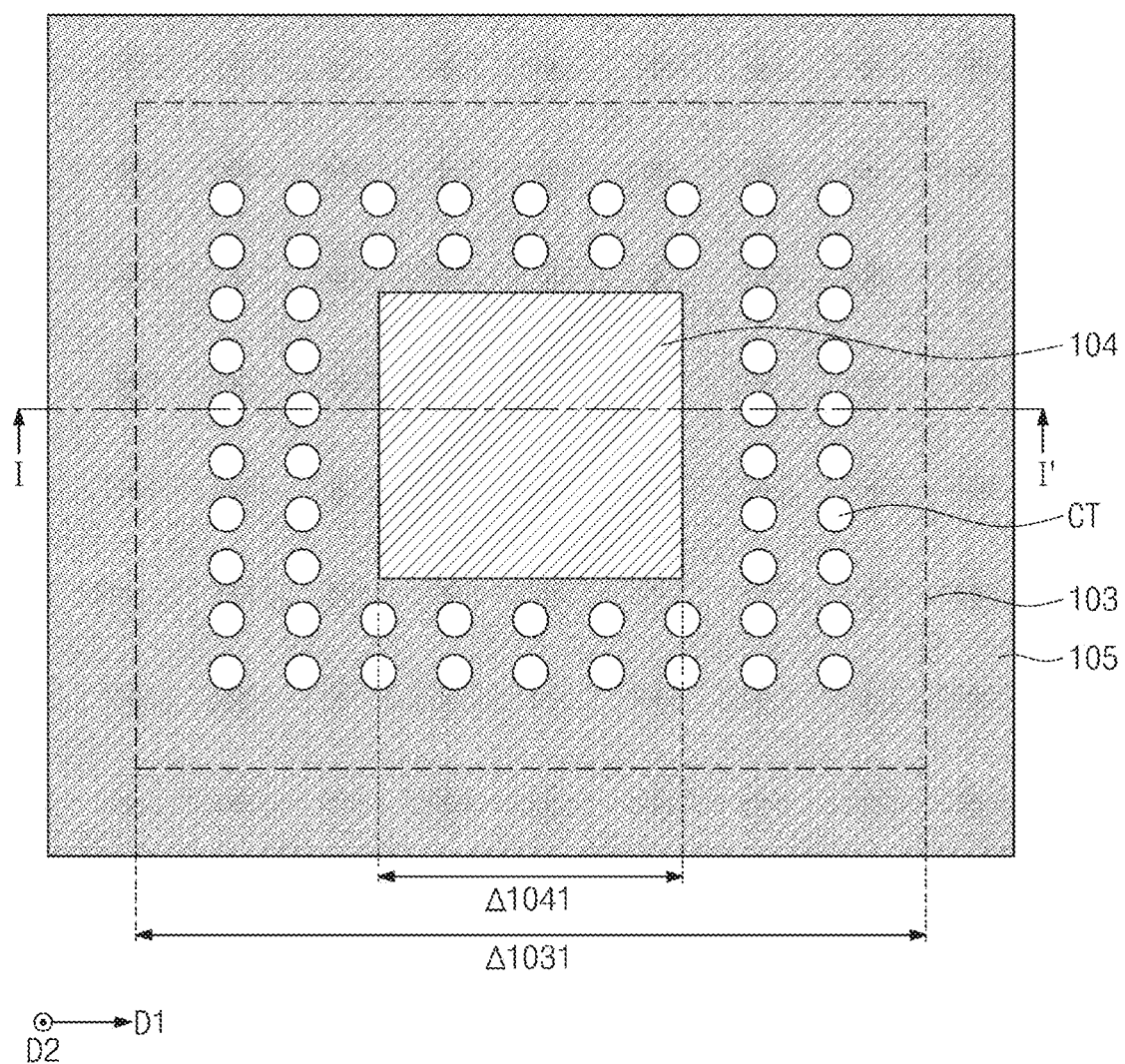
FIG. 1A is a plan view illustrating a semiconductor package device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. The same reference numerals or the same reference designators may denote the same elements or components throughout the specification.

Figure 1B:
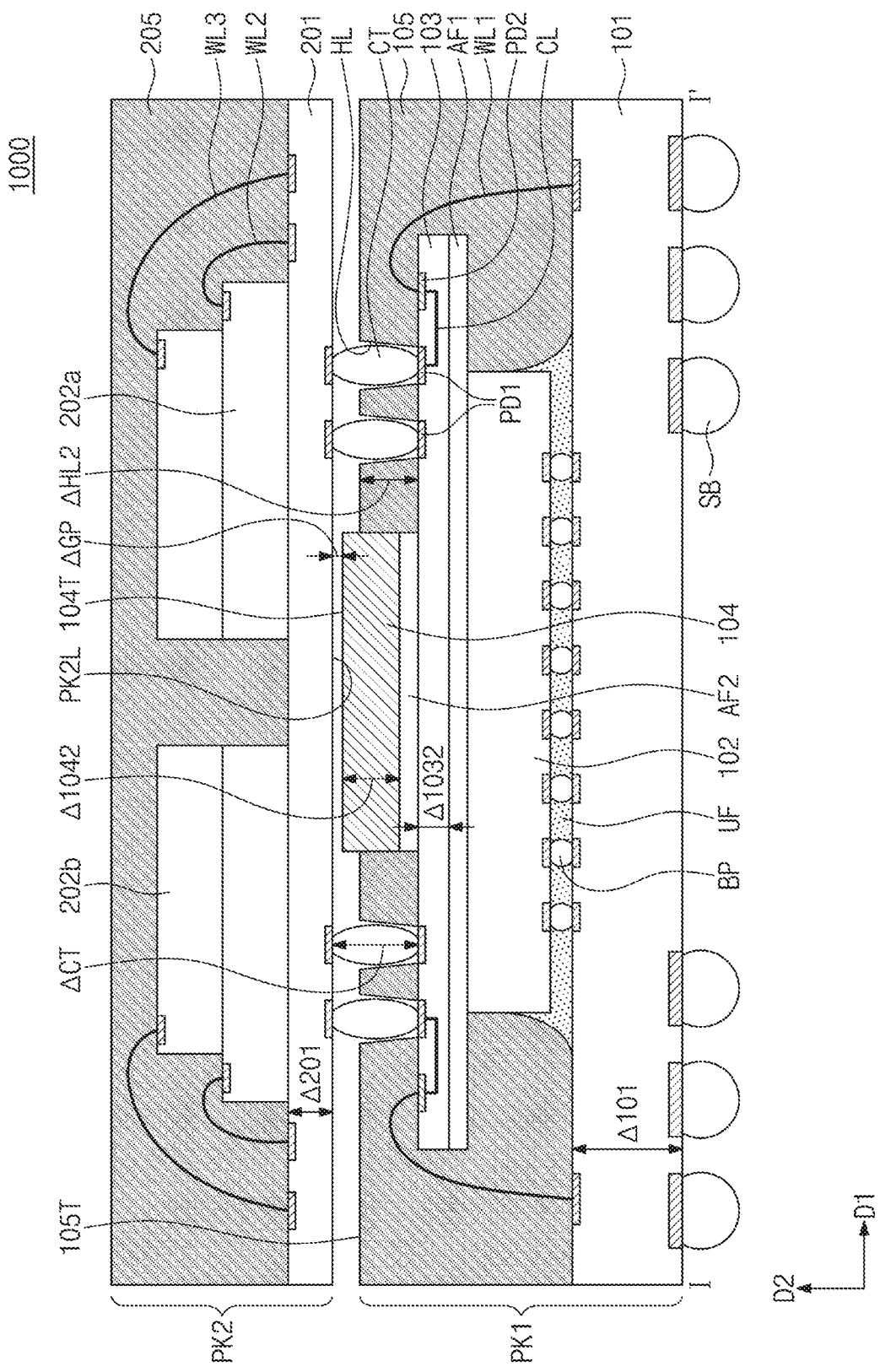
FIG. 1B is a sectional view taken along a line I-I' of FIG. 1A.

As used herein, the term "and/or" includes any and all combinations of one or more of the associated listed items. It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination FIG. 1A is a plan view illustrating a semiconductor package device according to some embodiments of the inventive concept. FIG. 1B is a sectional view taken along a line I-I' of FIG. 1A. To reduce complexity in the drawings, some of elements shown in FIG. 1B are omitted from FIG. 1A.

Referring to FIGS. 1A and 1B, a semiconductor package device 1000 according to some embodiments of the inventive concept may include a first package PK1 and a second package PK2 on the first package PK1. The first package PK1 and the second package PK2 may be electrically connected to each other through a connection terminal CT interposed therebetween.

The first package PK1 may include a first package substrate 101, a first semiconductor chip 102, an interposer 103, and a warpage prevention member 104.

The first package substrate 101 may include, for example, a printed circuit board (PCB) substrate. A plurality of solder balls SB may be disposed on a bottom surface of the first package substrate 101. The solder balls SB may be disposed in an edge portion of the first package substrate 101, i.e., at outer portions of the package substrate 101 as shown in the cross-sectional view of FIG. 1B. When the semiconductor package device 1000 is attached to a motherboard, the solder balls SB may serve as connection terminals.

The first semiconductor chip 102 may include, for example, an application processor (AP) chip. The first semiconductor chip 102 may be electrically connected to the first package substrate 101 through a plurality of bumps BP, which are attached to a bottom surface of the first semiconductor chip 102. The bottom surface of the first semiconductor chip 102 may serve as an active surface. A top surface of the first semiconductor chip 102 may be an inactive surface. The first semiconductor chip 102 may be mounted on the first package substrate 101 in a flip-chip bonding manner.

An under-fill layer UF may be provided in a gap between the first semiconductor chip 102 and the first package substrate 101 to seal or encapsulate the bumps BP. The under-fill layer UF may be formed of or include an insulating polymer material (e.g., epoxy).

The interposer 103 may be disposed on the first semiconductor chip 102. The interposer 103 may be a silicon interposer. The interposer 103 may have a top surface and a bottom surface opposite to each other. The bottom surface of the interposer 103 may face the first semiconductor chip 102 as shown in the cross-sectional view of FIG. 1B.

A planar area of the interposer 103 may be greater than a planar area of the first semiconductor chip 102 in some embodiments. At least a portion of an edge portion of the interposer 103 may overlap the first semiconductor chip 102 when viewed in a plan view. As also shown in FIG. 1B, at least a portion of an edge portion of the interposer 103 may not overlap the first semiconductor chip 102 in a vertical direction D2 that is generally perpendicular to an upper surface of the first package substrate.

A first adhesive layer AF1 may be provided between the first semiconductor chip 102 and the interposer 103. The first adhesive layer AF1 may be used to attach the interposer 103 to the first semiconductor chip 102. The first adhesive layer AF1 may extend along the bottom surface of the edge portion of the interposer 103 (i.e., the portion of the interposer 103 that does not overlap with the first semiconductor chip 102 in the D2 direction) in the D1 direction as shown in FIG. 1B.

A re-distribution layer (not shown) may be disposed on the interposer 103. The re-distribution layer (not shown) may include an insulating layer (not shown) and a redistribution pattern CL. The redistribution pattern CL may include via plugs (not shown) and interconnection lines (not shown).

A plurality of first pads PD1 and a plurality of second pads PD2 may be provided on the top surface of the interposer 103. The second pads PD2 may be disposed near the edges of the interposer 103 in the D1 direction as compared with the first pads PD1. The first pads PD1 may be pads in contact with connection terminals CT. The connection terminals CT may be vertically connected (i.e., in the D2 direction) to the first pads PD1. The first pads PD1 may be electrically connected to the second pads PD2 through the redistribution pattern CL. The second pads PD2 may be electrically connected to the first package substrate 101 through first wires WL1.

The warpage prevention member 104 may be disposed on the interposer 103. The warpage prevention member 104 may be formed of or include a material whose coefficient of thermal expansion (CTE) is higher than that of the interposer 103. Furthermore, the warpage prevention member 104 may be formed to have a thermal conductivity higher than the interposer 103. The warpage prevention member 104 may include, for example, a copper tape.

A warpage issue may be caused by heat that is provided when the second package PK2 is mounted on the first package PK1 or the semiconductor package device is mounted on the motherboard. The thermal expansion coefficient of the interposer 103 may be less than the thermal expansion coefficient of the first package substrate 101, and, as a result, warpage may occur due to such a difference in the thermal expansion coefficients between the first package substrate 101 and the interposer 103. Because the warpage prevention member 104 having a higher coefficient of thermal expansion (CTE) is disposed on the interposer 103, an upper portion of the interposer 103 may be further expanded, and this may make it possible to reduce the warpage issue in the mounting process. In addition, because the thermal conductivity of the warpage prevention member 104 is greater than the thermal conductivity of the interposer 103, the warpage prevention member 104 may exhaust heat of the interposer 103 to the outside (i.e., external to the semiconductor package device), and this may make it possible to suppress or prevent an internal temperature of the semiconductor package device 1000 from increasing to an excessively high level. Furthermore, when the warpage prevention member 104 is provided to have a specific thickness, the afore-described effects can be achieved by the warpage prevention member 104, as will be described below.

The warpage prevention member 104 may have a width Δ1041 in a first direction D1 parallel to the top surface of the first package substrate 101. The interposer 103 may have a width Δ1031 in the first direction D1. The width Δ1041 of the warpage prevention member 104 in the first direction D1 may be smaller than the width Δ1031 of the interposer 103 in the first direction D1. The width Δ1041 of the warpage prevention member 104 in the first direction D1 may be greater than or equal to 0.3 times the width Δ1031 of the interposer 103 in the first direction D1. The width Δ1041 of the warpage prevention member 104 in the first direction D1 may be, for example, 5 mm.

The warpage prevention member 104 may have a thickness Δ1042 in a second direction D2 perpendicular to the top surface of the first package substrate 101. The thickness Δ1042 of the warpage prevention member 104 in the second direction D2 may correspond to a thickness of the warpage prevention member 104. The thickness Δ1042 of the warpage prevention member 104 in the second direction D2 may be greater than a thickness Δ1032 of the interposer 103 in the second direction D2. The thickness Δ1042 of the warpage prevention member 104 in the second direction D2 may range from 100 μm to 150 μm.

A thickness ΔCT of the connection terminal CT in the second direction D2 may be equal to or greater than a thickness Δ1042 of the warpage prevention member 104 in the second direction D2. A difference between the thickness ΔCT of the connection terminal CT in the second direction D2 and the thickness Δ1042 of the warpage prevention member 104 in the second direction D2 may be less than or equal to 30 μm.

A second adhesive layer AF2 may be provided between the warpage prevention member 104 and the interposer 103. Each of top and bottom surfaces of the second adhesive layer AF2 may have an area corresponding to a bottom surface of the warpage prevention member 104. The second adhesive layer AF2 may overlap the warpage prevention member 104 in the second direction D2. A thickness of the second adhesive layer AF2 may be, for example, 10 μm.

A first molding member 105 may be provided to at least partially cover the interposer 103, the first semiconductor chip 102, and the first package substrate 101. The first molding member 105 may include a plurality of holes HL. The holes HL may be provided to at least partially expose the first pads PD1 on the interposer 103.

The first molding member 105 may cover at least a portion of a side surface of the warpage prevention member 104. The first molding member 105 may not cover or extend onto a top surface of the warpage prevention member 104. A top surface 104T of the warpage prevention member 104 may be positioned at a level that is equal to or higher than a level of a top surface 105T of the first molding member 105 as shown in the cross-sectional view of FIG. 1B in which the first package substrate 101 serves as a lowest reference layer. At least a portion of each of the side surfaces of the warpage prevention member 104 may be exposed by the first molding member 105.

At least a portion of a top surface of the first molding member 105 may be spaced apart from a bottom surface of a second package substrate 201, which will be described below.

At least a portion of the top surface 104T of the warpage prevention member 104 may be spaced apart from a bottom surface PK2L of the second package PK2. A distance ΔGP in the second direction D2 between the top surface 104T of the warpage prevention member 104 and the bottom surface PK2L of the second package PK2 may range from 10 μm to 30 μm. In certain embodiments, a portion of the top surface 104T of the warpage prevention member 104 may be in physical contact with the bottom surface PK2L of the second package PK2.

The second package PK2 may include the second package substrate 201, a plurality of second semiconductor chips 202a, and a second molding member 205. The second package substrate 201 may be, for example, a PCB substrate. The second package substrate 201 may have a thickness Δ201 in the second direction D2. The thickness Δ201 of the second package substrate 201 in the second direction D2 may be smaller than a thickness Δ101 of the first package substrate 101 in the second direction D2.

The second semiconductor chips 202a may be disposed on the second package substrate 201 so as to be spaced apart from each other. Each of the second semiconductor chips 202a may include, for example, a memory chip. A top surface of a second semiconductor chip 202a may serve as an active surface. A bottom surface of a second semiconductor chip 202a may be an inactive surface. The second semiconductor chips 202a and the second package substrate 201 may be electrically connected to each other through a second wire bonding WL2, which is provided to connect top surfaces of the second semiconductor chip 202a and the top surface of the second package substrate 201. In other words, the second semiconductor chips 202a may be mounted on the second package substrate 201 in a wire bonding manner.

The second package PK2 may further include a plurality of third semiconductor chips 202b. Each of the third semiconductor chips 202b may be provided on the second semiconductor chip 202a. The third semiconductor chips 202b may each include, for example, a memory chip. An adhesive film (not shown) may be provided between respective ones of the third semiconductor chips 202b and the second semiconductor chips 202a. A top surface of a third semiconductor chip 202b may serve as an active surface. A bottom surface of a third semiconductor chip 202b may be an inactive surface. The third semiconductor chips 202b and the second package substrate 201 may be electrically connected to each other through a third wire bonding WL3, which is provided to connect top surfaces of the third semiconductor chips 202b and the top surface of the second package substrate 201. In other words, the third semiconductor chips 202b may be mounted on the second package substrate 201 in a wire bonding manner.

The second molding member 205 may be provided to at least partially cover the second package substrate 201, the second semiconductor chips 202a, and the third semiconductor chips 202b. For example, the second molding member 205 may at least partially cover a region between the second semiconductor chips 202a and side surfaces of each of the second semiconductor chips 202a. The second molding member 205 may at least partially cover a region between the third semiconductor chips 202b and top and side surfaces of each of the third semiconductor chips 202b.

Figure 2:
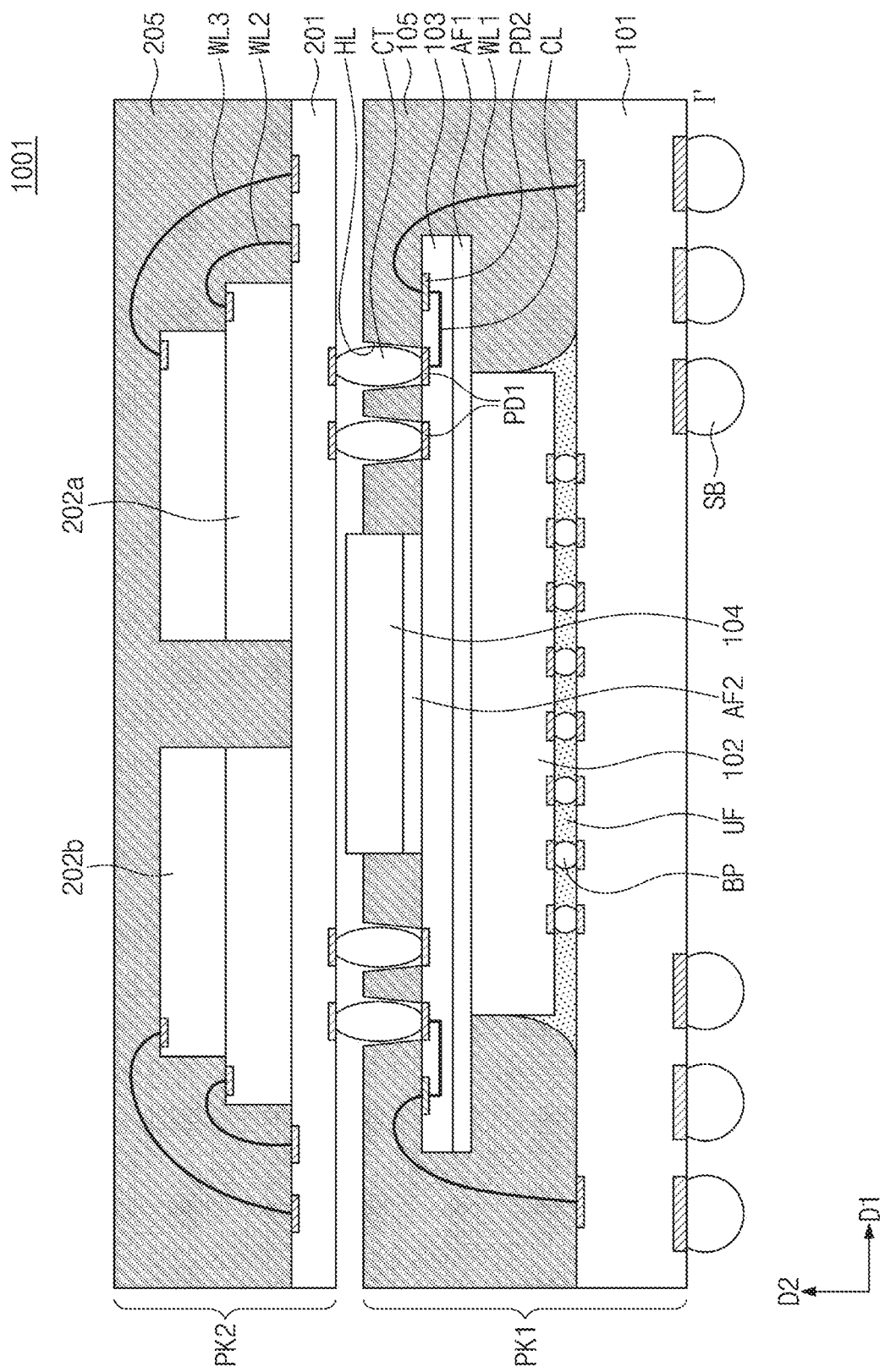
FIG. 2 is a sectional view illustrating a semiconductor package device according to some embodiments of the inventive concept.

FIG. 2 is a sectional view illustrating a semiconductor package device 1001 according to some embodiments of the inventive concept. For concise description, an element previously described with reference to FIGS. 1A and 1B will be identified by the same reference number without repeating a description thereof.

Referring to FIG. 2, the warpage prevention member 104 may include silicon. The warpage prevention member 104 may be a silicon pile. The silicon may be used instead of the copper tape. Because silicon may effectively exhaust heat, which is provided to the interposer 103 from the first semiconductor chip 102, to the outside of the semiconductor package device 1001, the use of silicon may improve the heat-dissipation characteristics of the semiconductor package device 1001.

FIGS. 3A to 3D are sectional views illustrating a method of fabricating a semiconductor package device, according to some embodiments of the inventive concept.

Figure 3A:
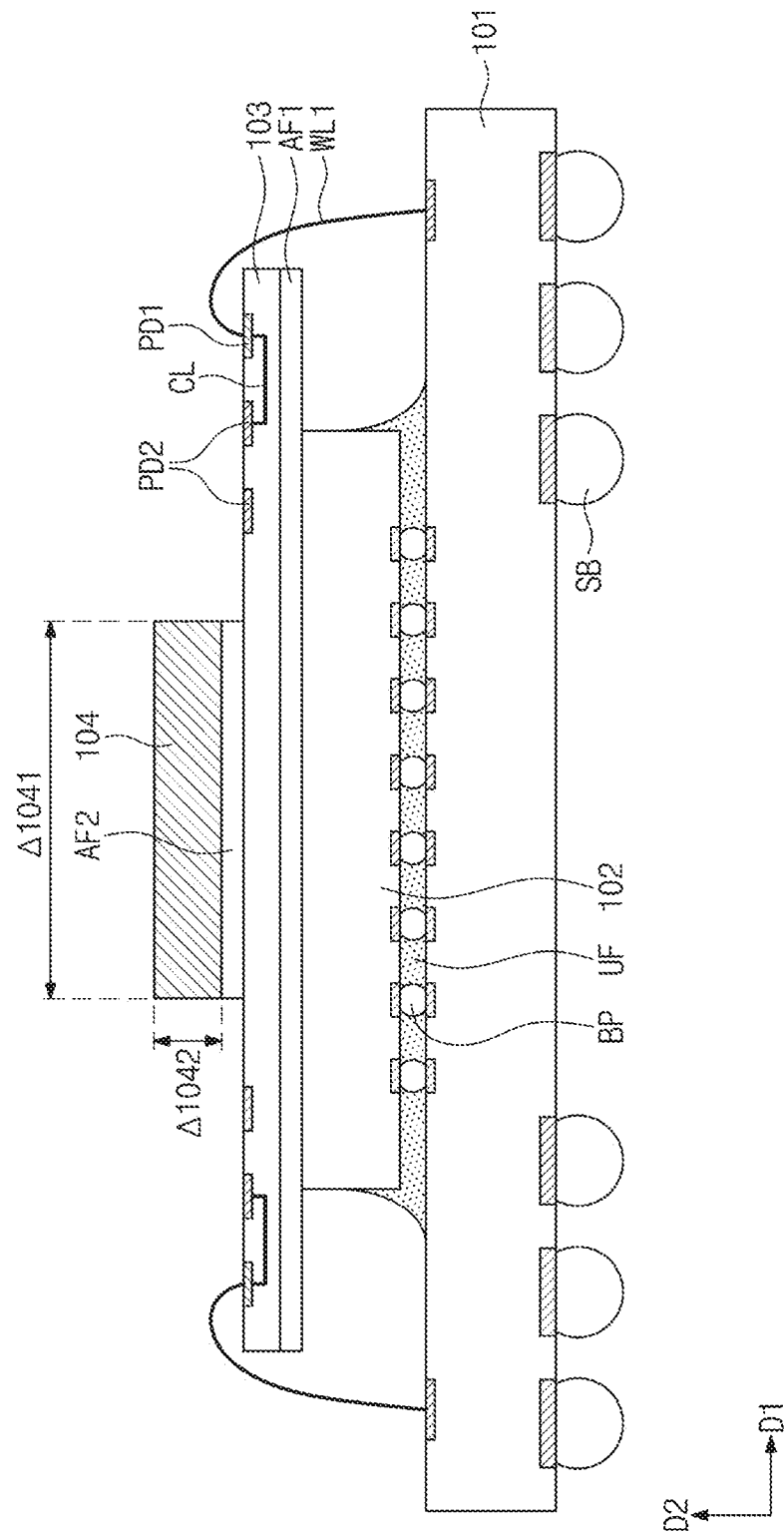
FIGS. 3A to 3D are sectional views illustrating a method of fabricating a semiconductor package device according to some embodiments of the inventive concept.

Referring to FIG. 3A, the first package substrate 101, on which the interposer 103 and the first semiconductor chip 102 are mounted, may be prepared. The solder balls SB may be provided on the bottom surface of the first package substrate 101. The bumps BP may be provided between the first semiconductor chip 102 and the first package substrate 101. The under-fill layer UF may be provided to fill a gap between the bumps BP. The interposer 103 may include the first pad PD1, the second pad PD2, and the redistribution pattern CL. The first adhesive layer AF1 may be interposed between the interposer 103 and the first semiconductor chip 102.

The warpage prevention member 104 may be mounted on the interposer 103 through the second adhesive layer AF2. The warpage prevention member 104 may include, for example, a copper tape. The copper tape may be prepared such that the width Δ1041 in the first direction D1 is about 5 μm. The copper tape may be prepared such that the thickness Δ1042 in the second direction D2 ranges from 100 μm to 150 μm. However, embodiments of the inventive concept are not limited to this example, and the width Δ1041 of the copper tape in the first direction D1 and the thickness Δ1042 of the copper tape in the second direction D2 may vary.

Figure 3B:
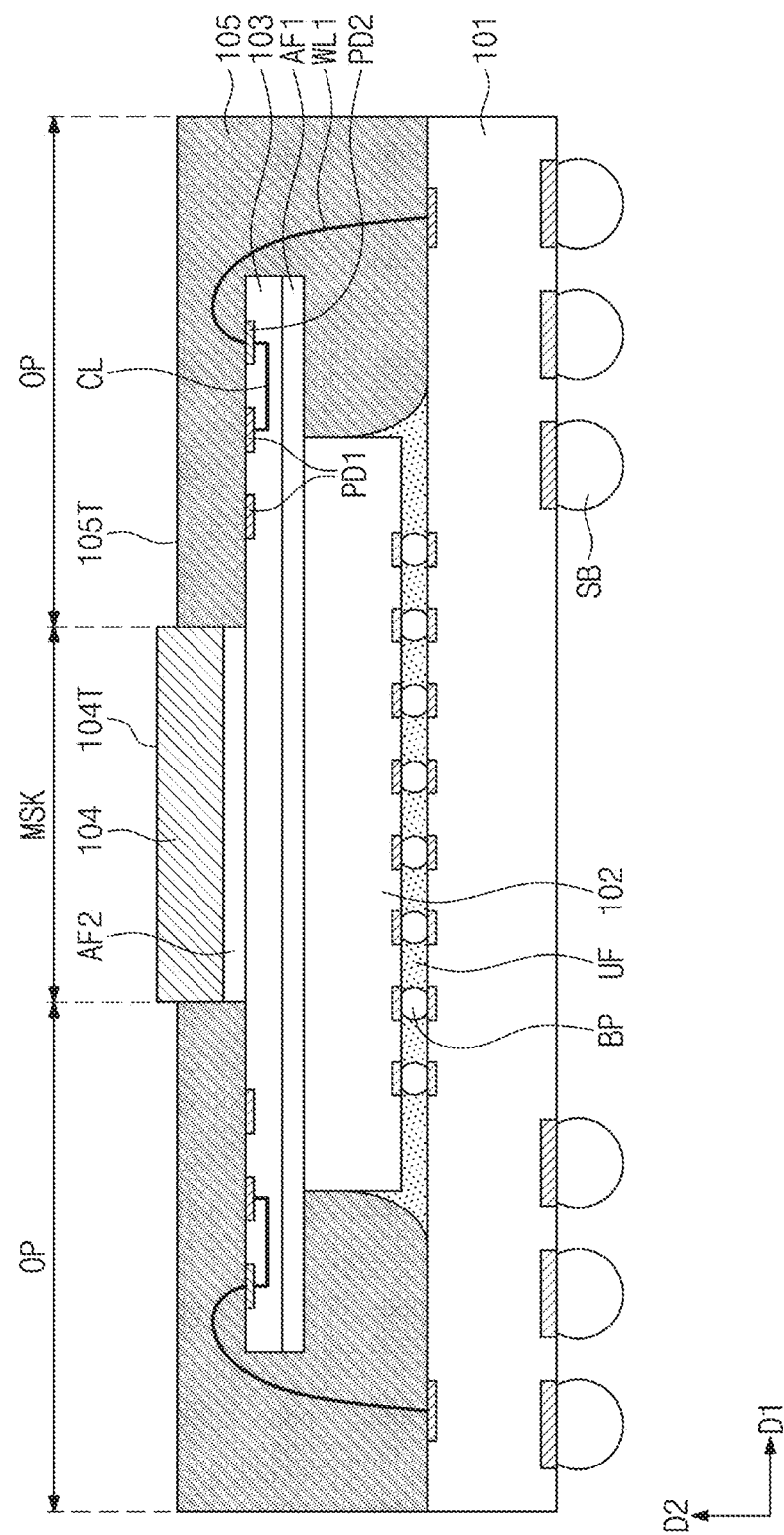

Referring to FIG. 3B, the first molding member 105 may be formed to at least partially cover the first package substrate 101.

During the formation of the first molding member 105, the top surface of the warpage prevention member 104 (i.e., the surface opposite the surface that is in engagement with the second adhesive layer AF2) may be protected by a mask (not shown) provided on the top surface of the warpage prevention member 104. In other words, the first molding member 105 may not be formed on a region MSK of the first package substrate 101 provided with the warpage prevention member 104. The first molding member 105 may be locally formed on a region OP of the first package substrate 101 exposed by a mask (not shown). The first molding member 105 may be formed such that a level of the top surface 105T thereof is equal to or lower than a level of the top surface 104T of the warpage prevention member 104. The mask (not shown) may be removed after the formation of the first molding member 105.

Figure 3C:
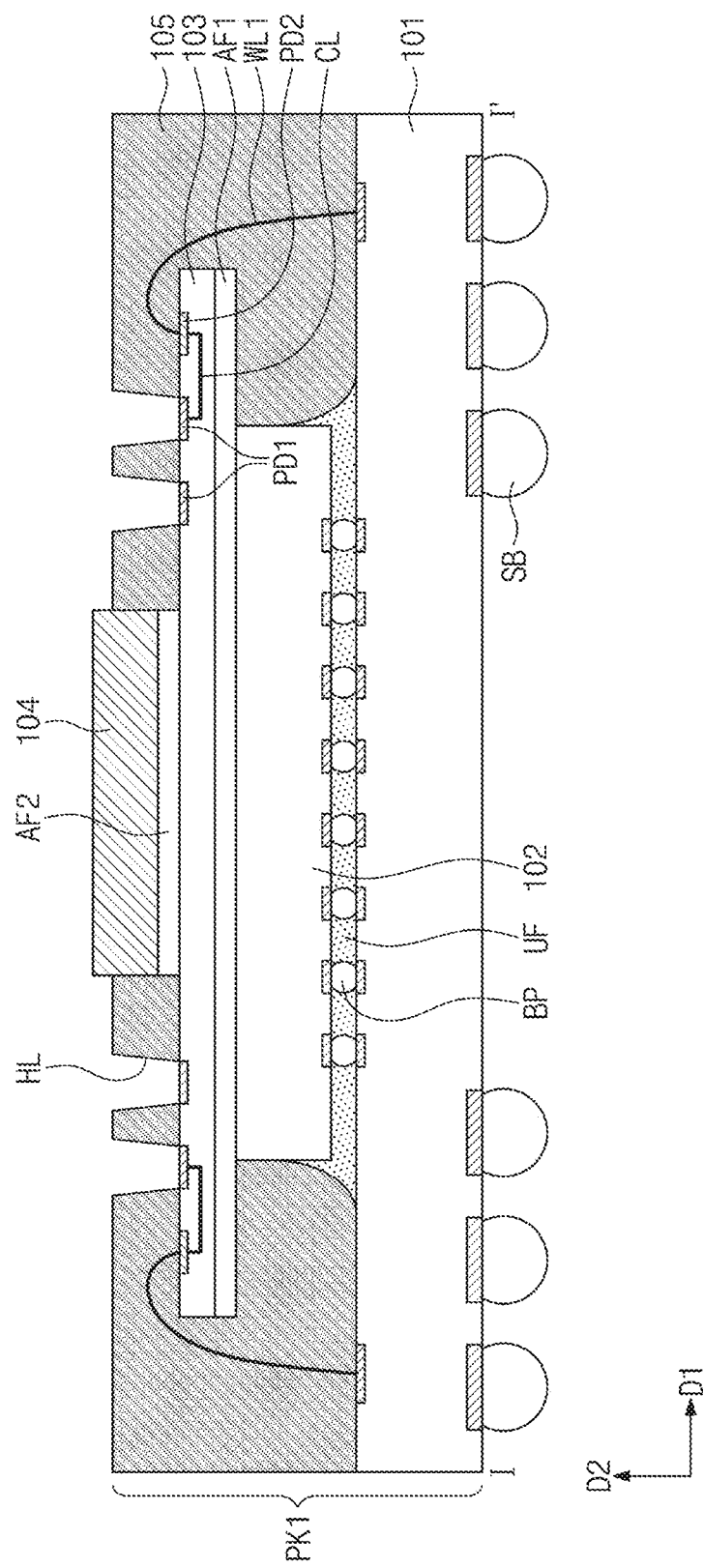

Referring to FIG. 3C, the holes HL may be formed in the first molding member 105. The holes HL may be formed by a laser drilling process. The first pads PD1 of the interposer 103 may be at least partially exposed through the holes HL.

Figure 3D:
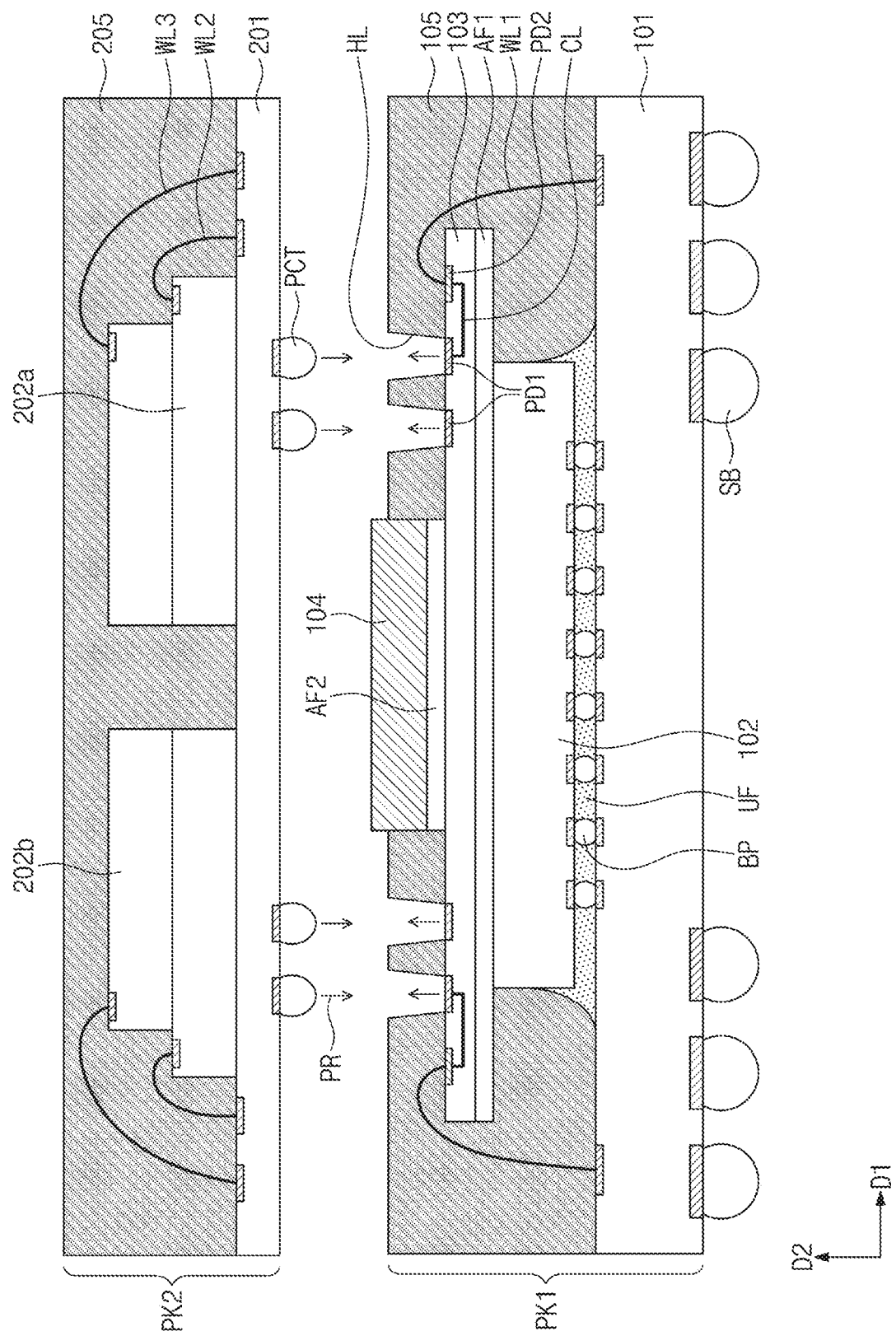

Referring to FIGS. 3D and 1B, the second package PK2 may be mounted on the first package PK1. A plurality of preliminary connection terminals PCT, which are attached to a bottom surface of the second package PK2, may be aligned and attached to the first pads PD1 of the first package PK1. The preliminary connection terminals PCT may form the connection terminals CT, which are attached to the first pads PD1, through a reflow process. The mounting process of the second package PK2 may include a compression process PR. Even when the second package PK2 is mounted on the first package PK1, the top surface 104T of the warpage prevention member 104 may be spaced apart from the bottom surface PK2L of the second package PK2, as shown in FIG. 1B. In certain embodiments, during the reflow process, a portion of the top surface 104T of the warpage prevention member 104 may be in physical contact with the bottom surface PK2L of the second package PK2.

Figure 4A:
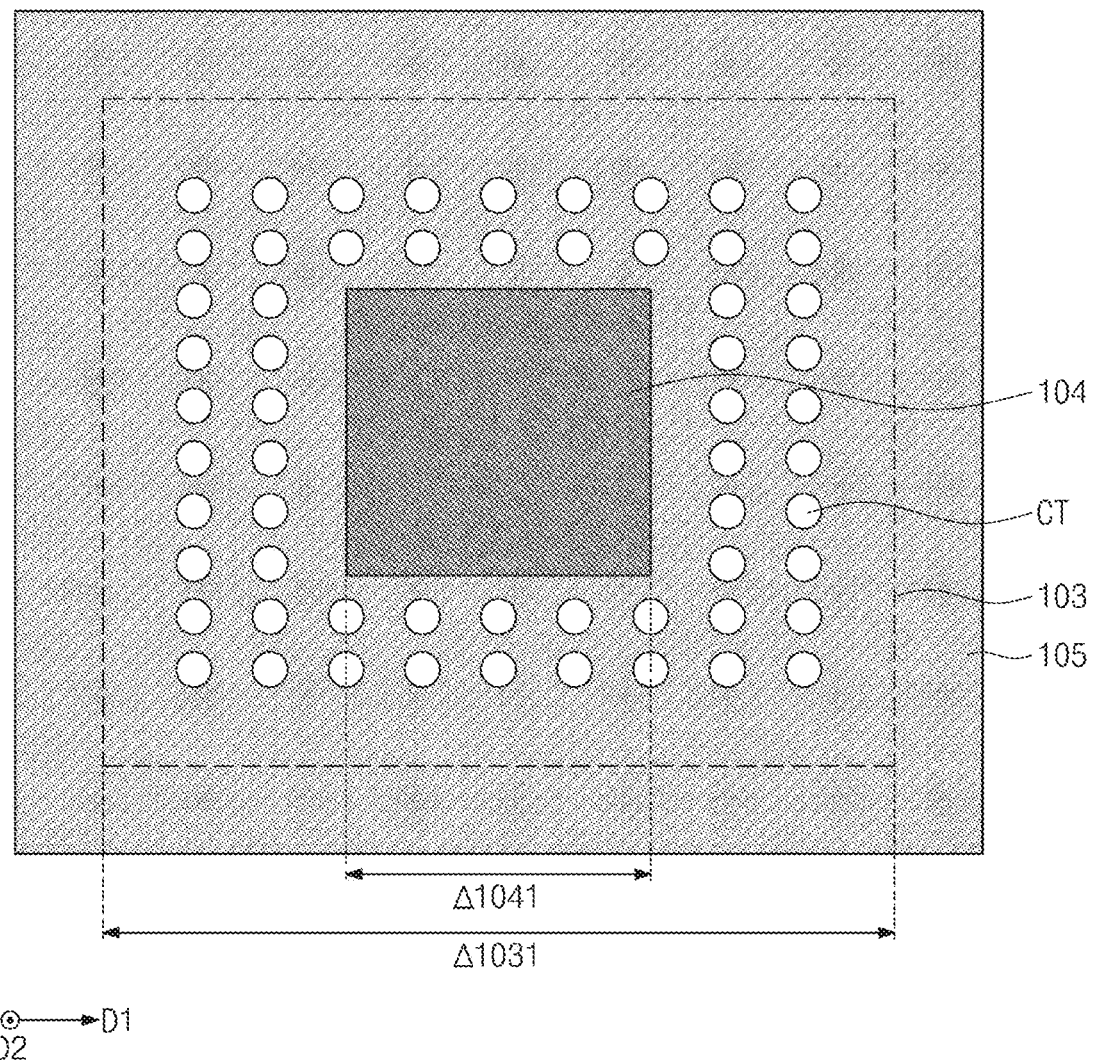
FIG. 4A is a plan view illustrating a semiconductor package device according to some embodiments of the inventive concept.
Figure 4B:
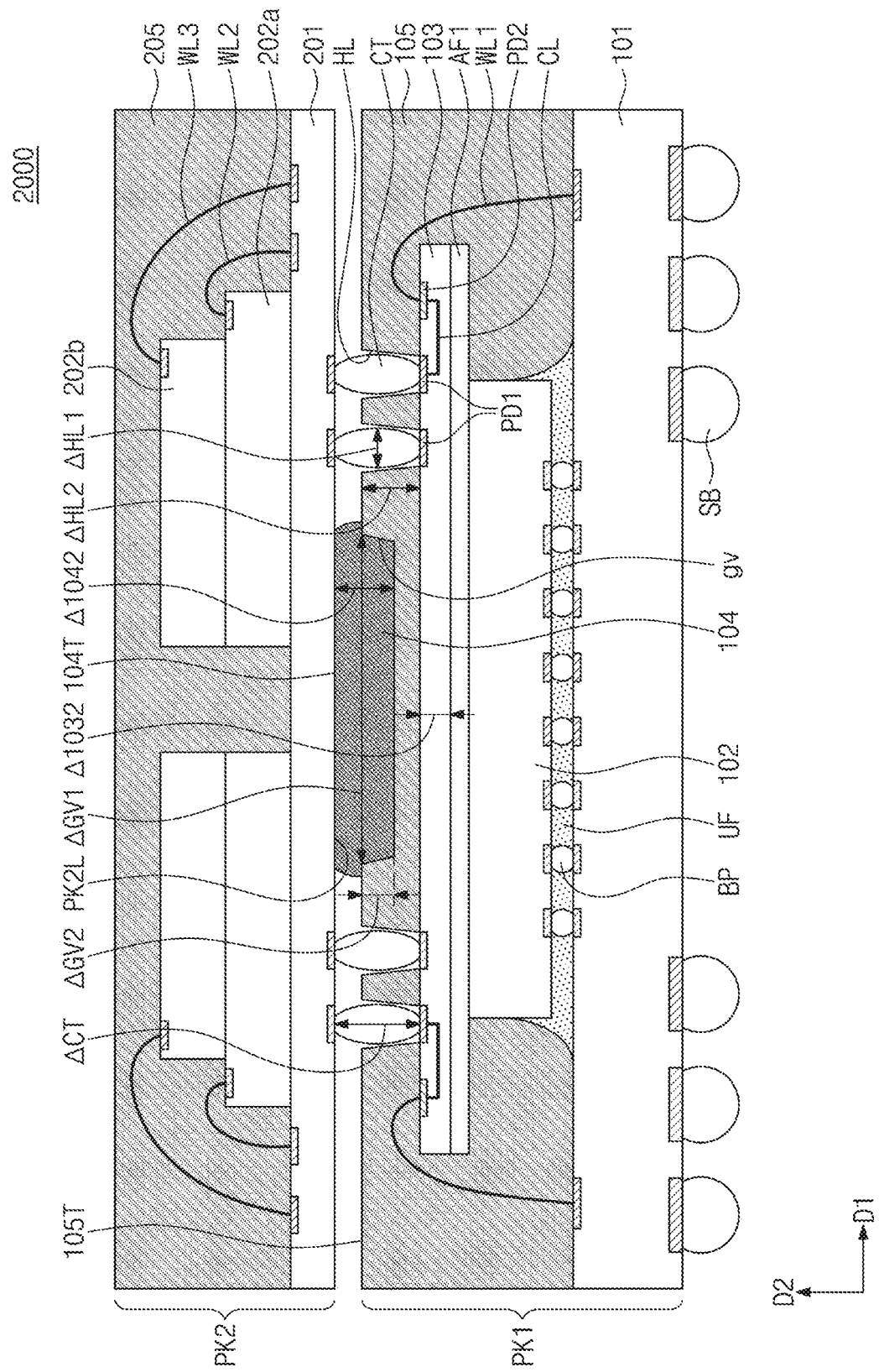
FIG. 4B is a sectional view of the semiconductor package device shown in FIG. 4A.

FIG. 4A is a plan view illustrating a semiconductor package 2000 device according to some embodiments of the inventive concept. FIG. 4B is a sectional view of the semiconductor package device shown in FIG. 4A. To reduce complexity in the drawings, some of elements shown in FIG. 4B are omitted from FIG. 4A. For concise description, an element previously described with reference to FIGS. 1A and 1B will be identified by the same reference number without repeating a description thereof.

Referring to FIGS. 4A and 4B, the first molding member 105 may at least partially cover the top surface of the interposer 103. At least a portion of the top surface of the first molding member 105 may be spaced apart from the bottom surface of the second package substrate 201. The first molding member 105 may be formed to have a groove gv, which is defined on the interposer 103.

The warpage prevention member 104 may be disposed in the groove gv. For example, a portion of the first molding member 105 may be interposed between the warpage prevention member 104 and the interposer 103. The warpage prevention member 104 may be spaced apart from the interposer 103 with a portion of the first molding member 105 interposed therebetween. The bottom surface of the warpage prevention member 104 may be in physical contact with a portion of the first molding member 105. At least a portion of the side surface of the warpage prevention member 104 may be enclosed by the first molding member 105. A portion of the warpage prevention member 104 may extend from a side surface of the groove gv of the first molding member 105 to at least partially cover a portion of the top surface of the first molding member 105.

The top surface 104T of the warpage prevention member 104 may be in physical contact with the bottom surface PK2L of the second package PK2. The warpage prevention member 104 may not be in physical contact with the connection terminal CT. When viewed in a plan view, the warpage prevention member 104 may be enclosed in part or in full by the connection terminals CT.

The warpage prevention member 104 may be formed by solidifying a liquid non-conductive paste (NCP). The non-conductive paste may include, for example, a polymer. A thermal expansion coefficient of the solidified non-conductive paste may be higher than a thermal expansion coefficient of the interposer 103. In some embodiments, the warpage prevention member 104 may also be used as an adhesive layer attaching the first package PK1 to the second package PK2.

The width Δ1041 of the warpage prevention member 104 in the first direction D1 may be greater than 0.3 times the width Δ1031 of the interposer 103 in the first direction D1. The thickness Δ1042 of the warpage prevention member 104 in the second direction D2 may be greater than the thickness Δ1032 of the interposer 103 in the second direction D2. The thickness Δ1042 of the warpage prevention member 104 in the second direction D2 may range from 100 µm to 250 µm. For example, the thickness Δ1042 of the warpage prevention member 104 in the second direction D2 may be about 150 µm.

The groove gv may have a width Δgv1 in the first direction D1, and the hole HL may have a width ΔHL1 in the first direction D1. The width Δgv1 of the groove gv in the first direction D1 may be greater than the width ΔHL1 of the hole HL in the first direction D1. The groove gv may have a depth Δgv2 in the second direction D2, and the hole HL may have a depth ΔHL2 in the second direction D2. The depth Δgv2 of the groove gv in the second direction D2 may be less than the depth ΔHL2 of the hole HL in the second direction D2.

Figure 5A:
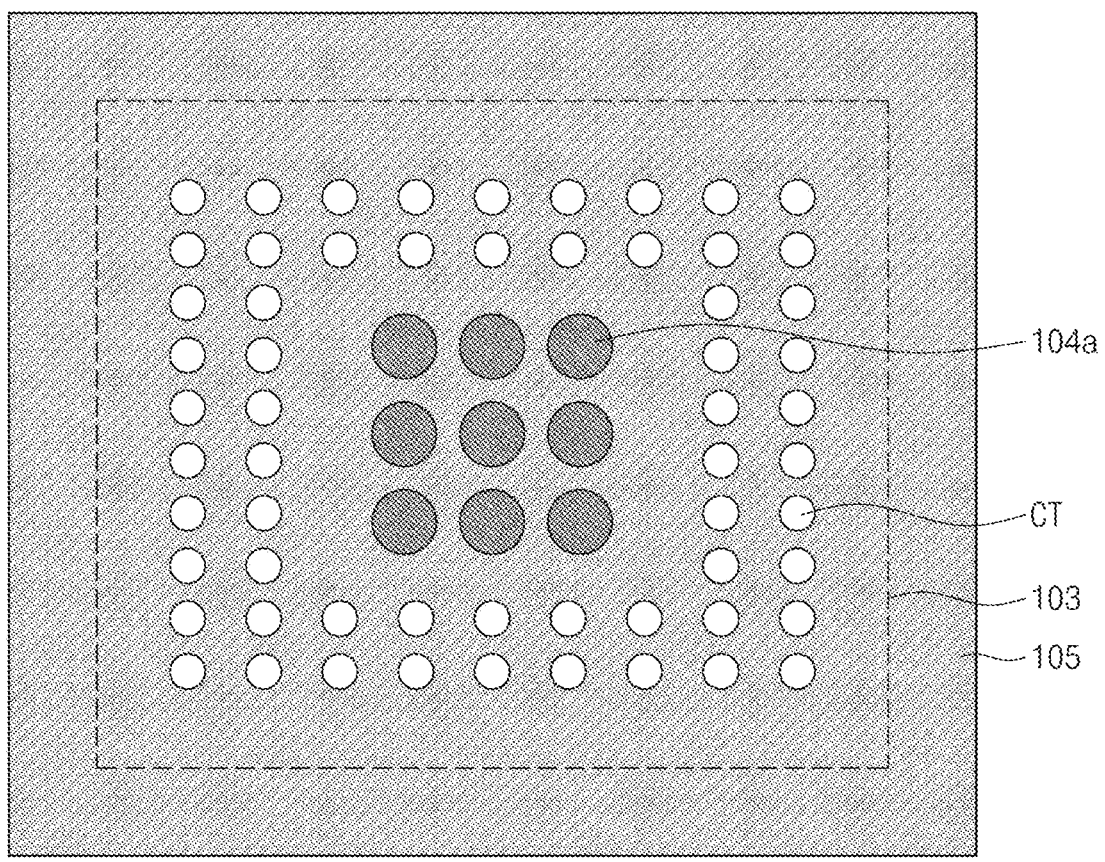
FIG. 5A is a plan view illustrating a semiconductor package device according to some embodiments of the inventive concept.
Figure 5B:
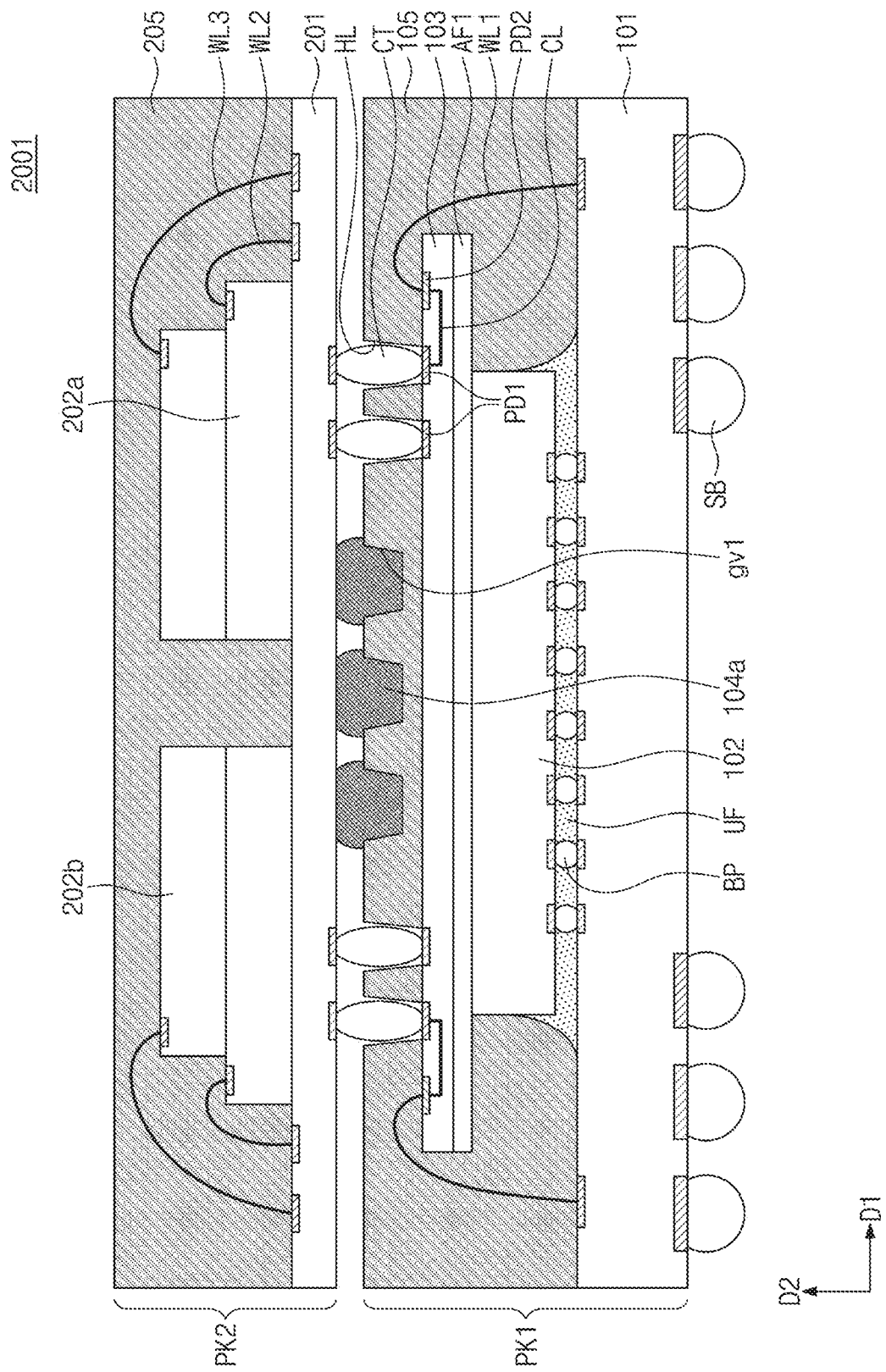
FIG. 5B is a sectional view of the semiconductor package device shown in FIG. 5A.

FIGS. 5A and 5B are diagrams illustrating a semiconductor package device 2001 according to some embodiments of the inventive concept. For concise description, an element previously described with reference to FIGS. 4A and 4B will be identified by the same reference number without repeating a description thereof.

Referring to FIGS. 5A and 5B, the first molding member 105 may include a plurality of first grooves gv1. A first warpage prevention member 104a may be disposed in each of the first grooves gv1. Each of the first warpage prevention members 104a may have a circular shape or a circle-like shape when viewed in a plan view. When viewed in a plan view, the first warpage prevention members 104a may be two-dimensionally arranged on the first molding member 105.

Figure 6A:
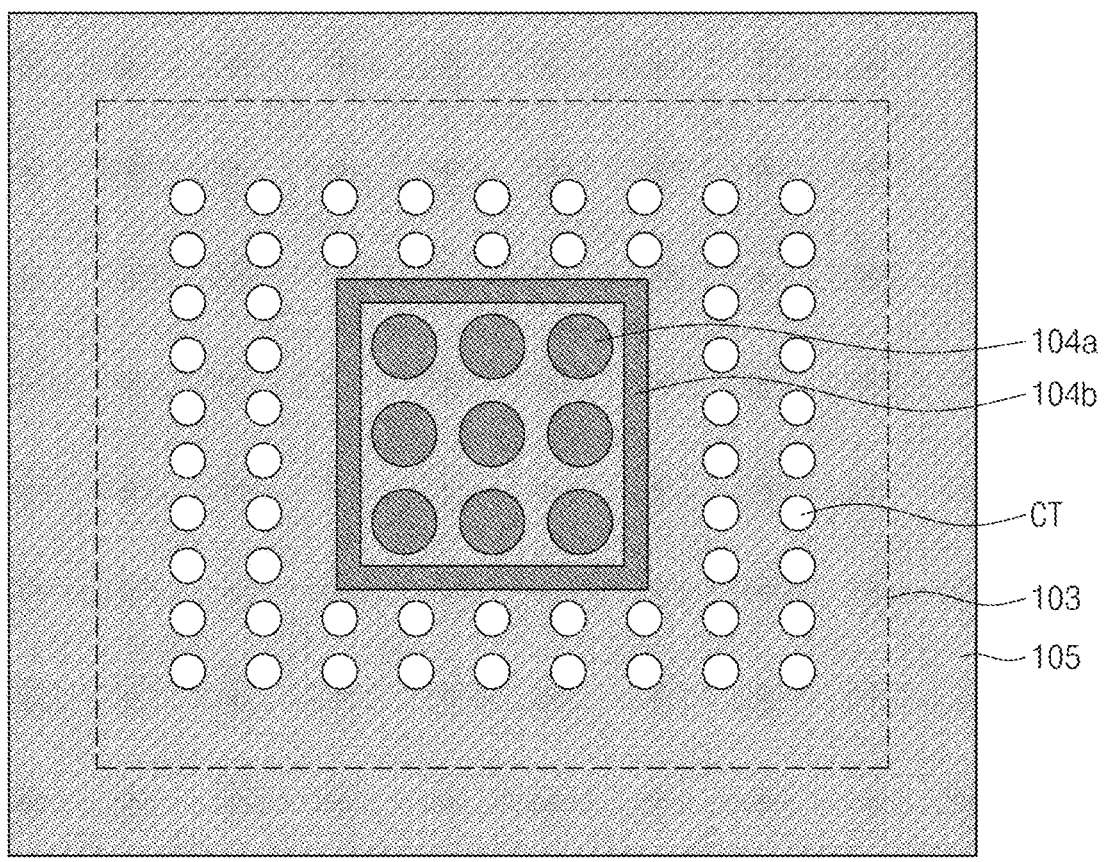
FIG. 6A is a plan view illustrating a semiconductor package device according to some embodiments of the inventive concept.

FIGS. 6A and 6B are diagrams illustrating a semiconductor package device 2002 according to some embodiments of the inventive concept. For concise description, an element previously described with reference to FIGS. 4A and 4B will be identified by the same reference number without repeating a description thereof.

Referring to FIGS. 6A and 6B, the first molding member 105 may include a first groove gv1 and a second groove gv2. A second warpage prevention member 104b may at least partially enclose the first warpage prevention members 104a when viewed in a plan view. The second groove gv2 may have a ring, square, or rectangular shape when viewed in a plan view.

FIGS. 7A to 7D are sectional views illustrating a method of fabricating a semiconductor package device, according to some embodiments of the inventive concept.

Figure 7A:
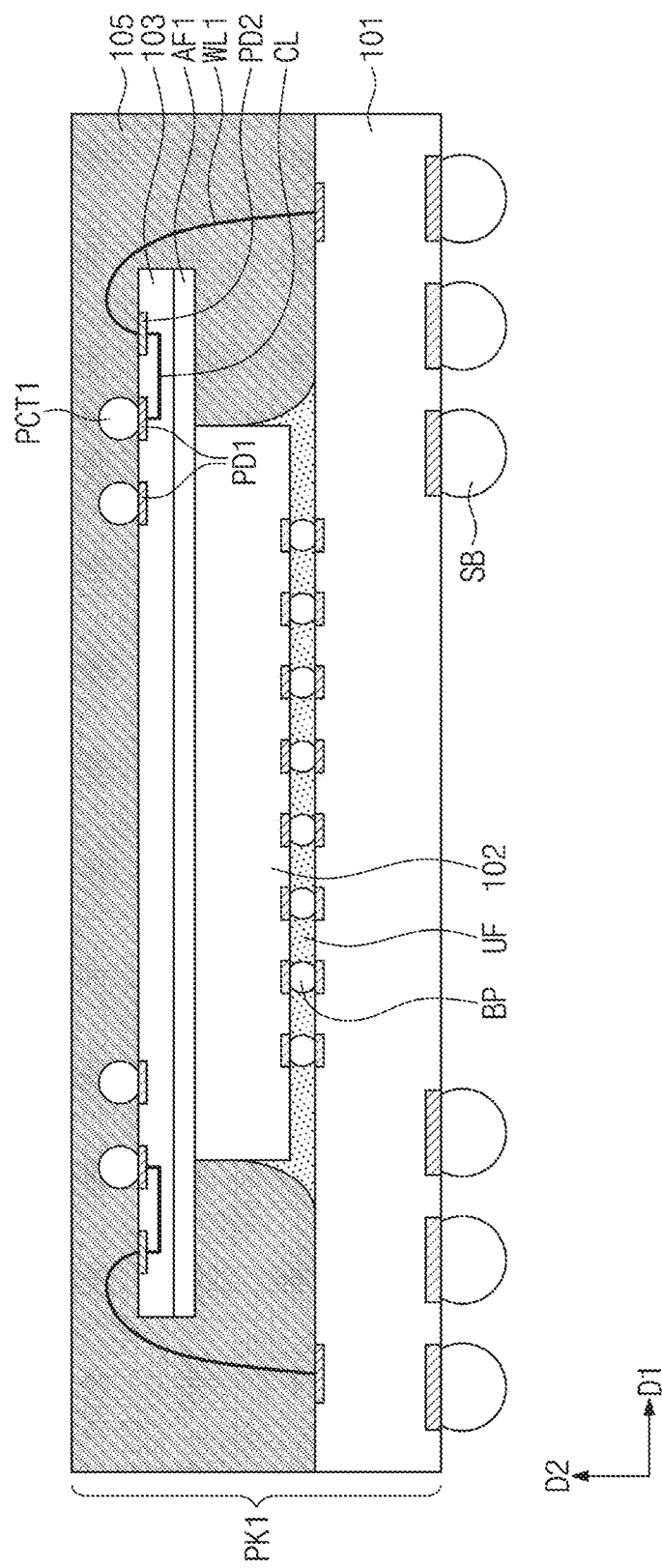
FIGS. 7A to 7D are sectional views illustrating a method of fabricating a semiconductor package device according to some embodiments of the inventive concept.

Referring to FIG. 7A, the first package substrate 101, on which the interposer 103 and the first semiconductor chip 102 are mounted, may be prepared. The solder balls SB may be provided on the bottom surface of the first package substrate 101. The bumps BP may be provided between the first semiconductor chip 102 and the first package substrate 101. The under-fill layer UF may be provided to at least partially fill a gap between the bumps BP. The interposer 103 may include the first pad PD1, the second pad PD2, and the redistribution pattern CL. First preliminary connection terminals PCT1 may be provided on the first pad PD1. In some embodiments, the first preliminary connection terminal PCT1 may be omitted, as shown in FIG. 3A. The first adhesive layer AF1 may be interposed between the interposer 103 and the first semiconductor chip 102.

The first molding member 105 may be formed to at least partially cover the first package substrate 101. The first molding member 105 may at least partially cover the top and side surfaces of the interposer 103. The formation of the first molding member 105 may include forming a molding material (not shown) to at least partially cover the first package substrate 101 and curing the molding material.

Figure 7B:
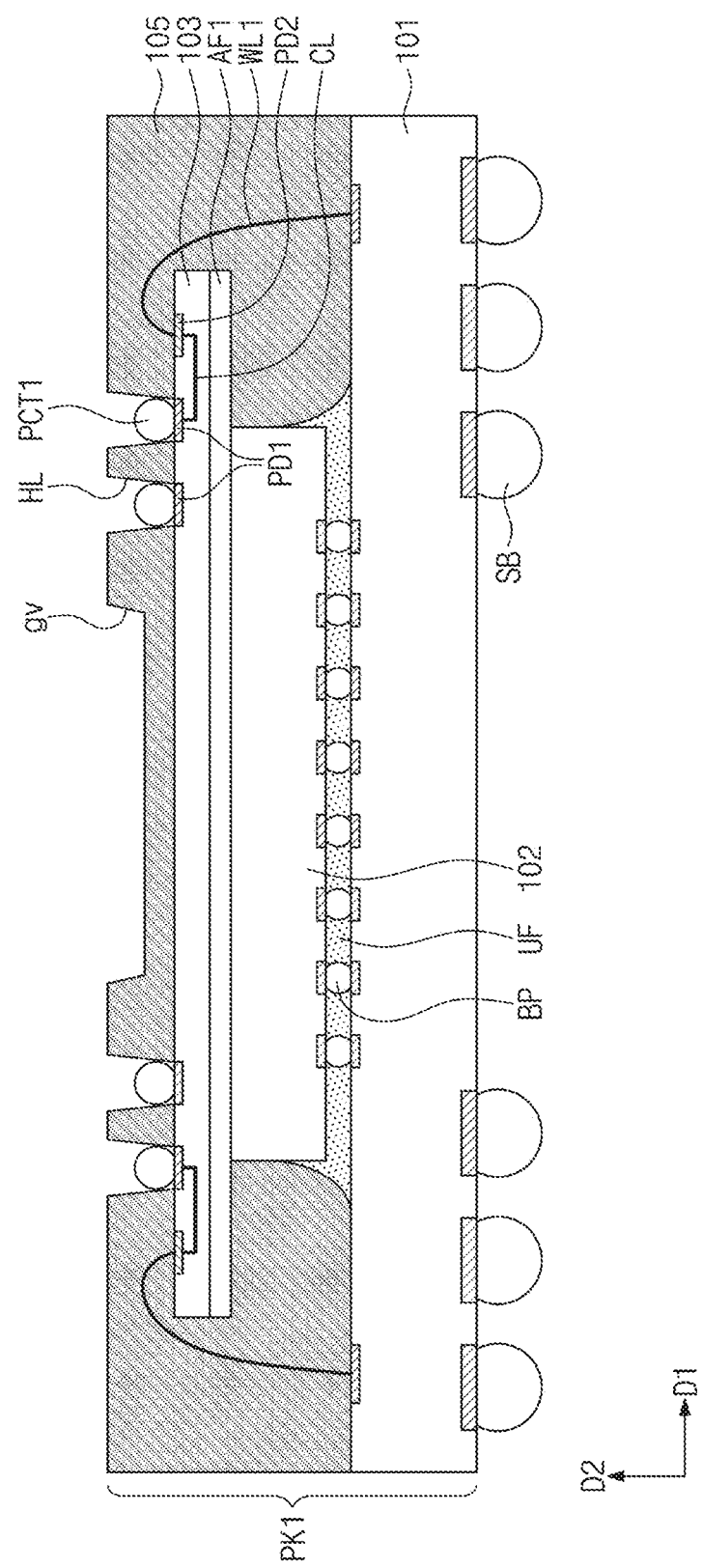

Referring to FIG. 7B, the groove gv and the holes HL may be formed in an upper portion of the first molding member 105. The groove gv and the holes HL may be formed by a laser drilling process.

In certain embodiments, the groove gv may be formed by using an additional casting mold (not shown) before the curing of the molding material (not shown). The holes HL may be formed to expose the first pads PD1 of the interposer 103.

Figure 7C:
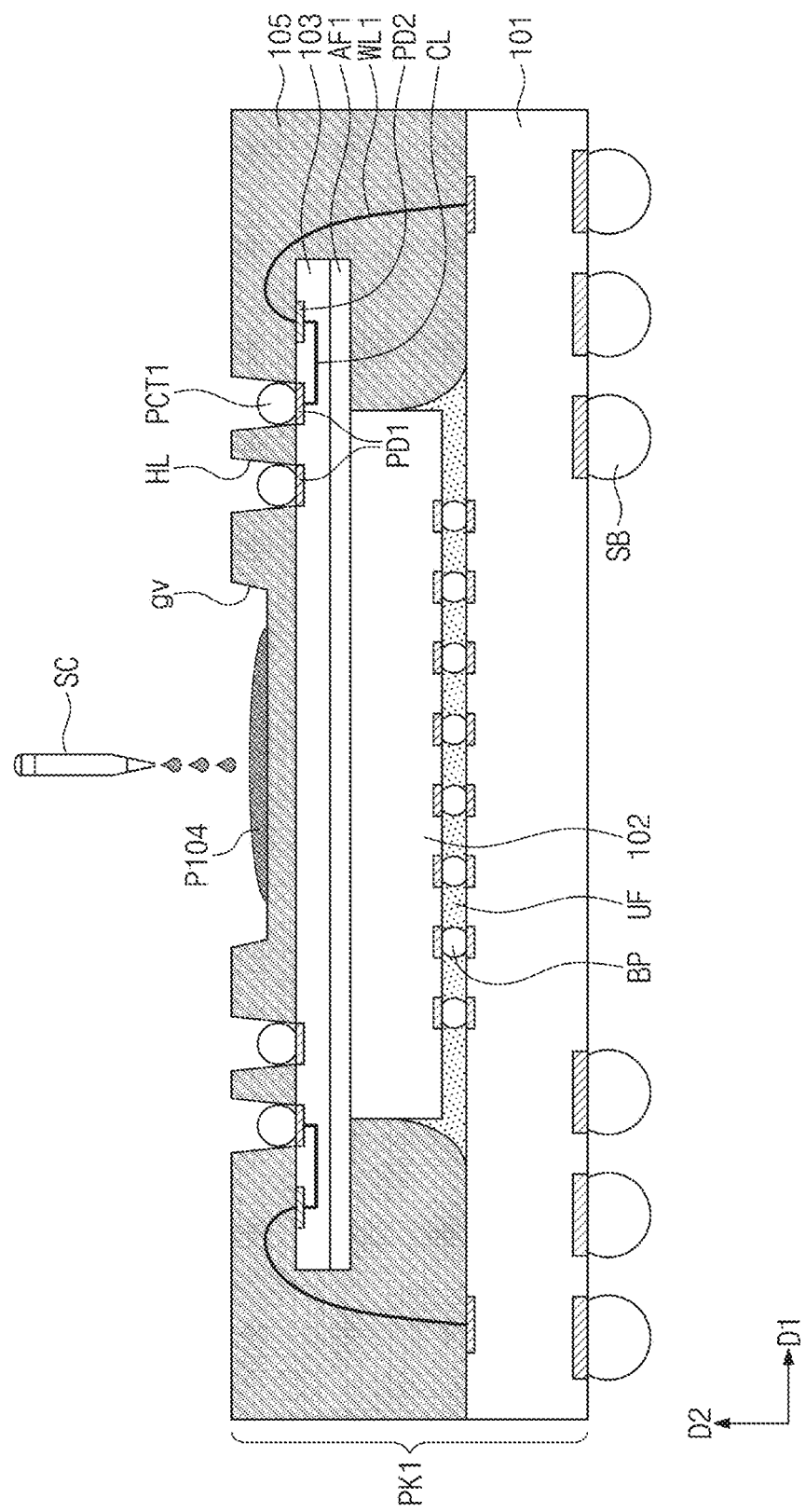

Referring to FIG. 7C, a liquid warpage prevention material P104 may be dispensed toward the groove gv from a source SC, which is placed on the first molding member 105. The liquid warpage prevention material P104 may include, for example, a liquid non-conductive paste (NCP). The liquid warpage prevention material P104 may be formed to selectively at least partially fill the groove gv. The hole HL may not be filled with, e.g., may be free of, the liquid warpage prevention material P104.

Figure 7D:
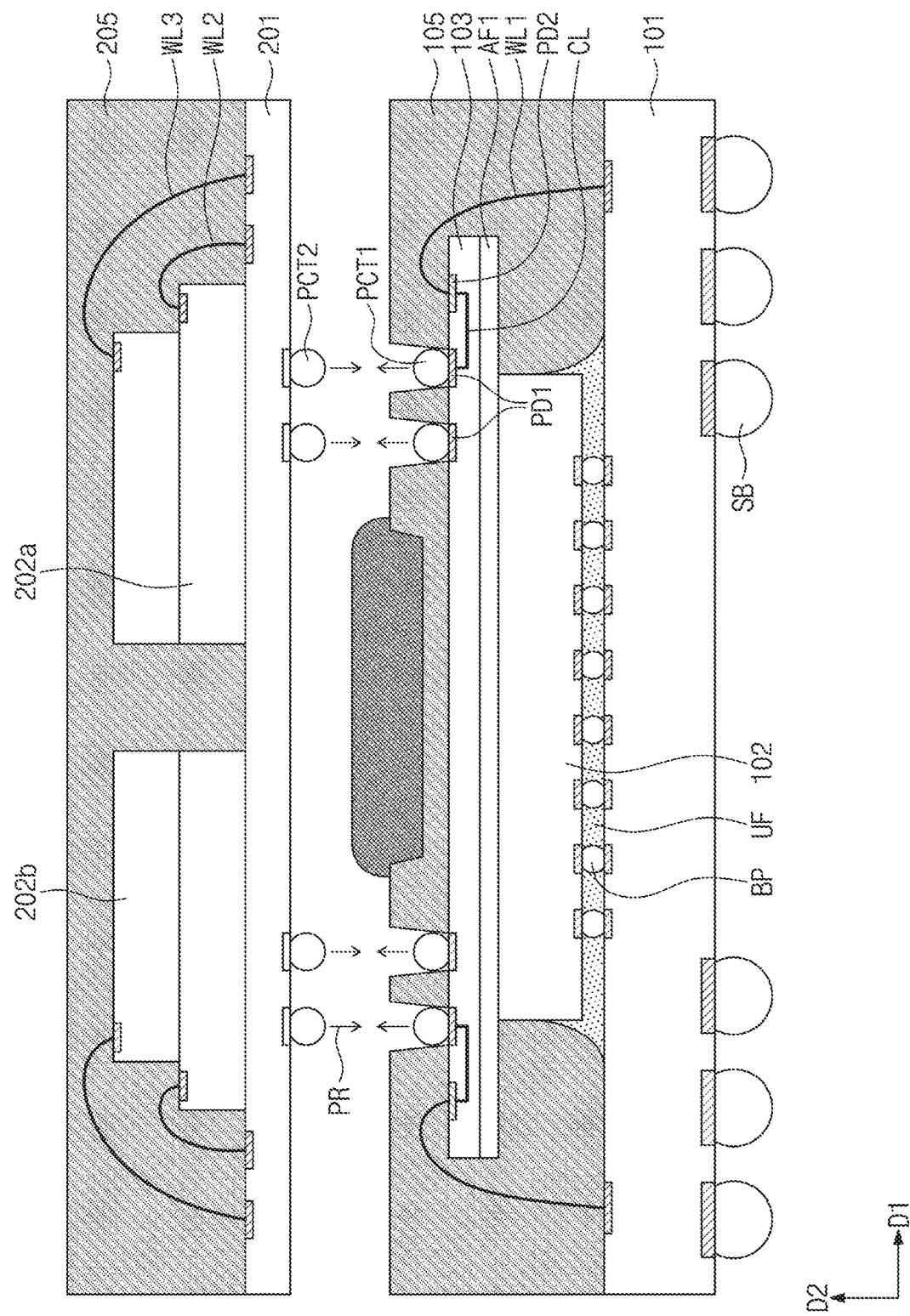

Referring to FIG. 4A in conjunction with FIG. 7D, the second package PK2 may be mounted on the first package PK1. A plurality of second preliminary connection terminals PCT2, which are attached to the bottom surface of the second package PK2, may be aligned to the first preliminary connection terminals PCT1 of the first package PK1 and then may be reflowed to form the connection terminals CT through a reflow process. The mounting process of the second package PK2 may include a compression process PR. The compression process PR may be performed to bring the liquid warpage prevention material P104 into contact with the bottom surface of the second package PK2. In this process, a portion of the liquid warpage prevention material P104 may overflow to a portion of the top surface of the first molding member 105 near the groove gv, but may not enter into the hole HL.

In some embodiments, a curing process may be further performed after the compression and reflow processes. The curing process may be a thermal treatment process that is performed at a lower temperature than that in the reflow process. An unsolidified portion of the liquid warpage prevention material P104 may be solidified through the curing process to form the warpage prevention member 104.

According to some embodiments of the inventive concept, when a silicon interposer is used as a material for an interposer of a semiconductor package device, it may be possible to improve heat-dissipation characteristics of the semiconductor package device, compared with the use of a substrate made of an organic material. However, the use of the silicon interposer may lead to a warpage issue. By placing a material having a high thermal expansion coefficient on the silicon interposer, it may be possible to mitigate the warpage issue.

Furthermore, according to some embodiments of the inventive concept, a space on the silicon interposer, in which a connection terminal is not disposed, may be provided to have an effective structure, and a warpage prevention member may be attached to the space. Accordingly, it may be possible to effectively suppress the warpage issue. In addition, the warpage prevention member may be provided to have a specific material and a specific thickness, and this may make it possible to more effectively suppress the warpage issue.

According to some embodiments of the inventive concept, it may be possible to suppress a warpage issue of a semiconductor package device and to improve a thermal conductivity property of the semiconductor package device.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package device, comprising:
a first package;
a second package on the first package; and
a plurality of connection terminals electrically connecting the first package to the second package,
wherein the first package comprises:
a first package substrate;
a first semiconductor chip on the first package substrate;
an interposer on the first semiconductor chip;
a first adhesive layer interposed between the first semiconductor chip and the interposer;
a warpage prevention member on the interposer;
a second adhesive layer between the warpage prevention member and the interposer; and
a first molding member on the interposer and the first package substrate,
wherein the second package comprises:
a second package substrate connected to the plurality of connection terminals;
second semiconductor chips on the second package substrate and spaced apart from each other; and
a second molding member in a region between the second semiconductor chips and side surfaces of the second semiconductor chips,
wherein at least a portion of an upper portion of the first molding member is spaced apart from the second package substrate,
wherein a top surface of the warpage prevention member is free of the first molding member, and
wherein the warpage prevention member has a thickness in a direction perpendicular to a top surface of the first package substrate and a thermal expansion coefficient that are greater than those of the interposer.

2. A semiconductor package device, comprising:
a first package substrate;
a first semiconductor chip on the first package substrate;
an interposer on the first semiconductor chip;
a molding member on the interposer, first semiconductor chip, and the first package substrate;
a warpage prevention member and a plurality of connection terminals on the interposer, the interposer being between the warpage prevention member and the first semiconductor chip; and
a second package substrate on the warpage prevention member and in electrical contact with the plurality of connection terminals,
wherein at least a portion of a top surface of the molding member is spaced apart from the second package substrate, and
a first thickness of the connection terminals is greater than a thickness of the warpage prevention member in a direction perpendicular to a top surface of the first package substrate.

3. The semiconductor package device of claim 2, wherein the warpage prevention member comprises a solidified non-conductive paste.

4. The semiconductor package device of claim 2, wherein a thickness of the warpage prevention member ranges from 100 μm to 150 μm.

5. The semiconductor package device of claim 2, wherein the connection terminals surround the warpage prevention member, when viewed in a plan view.

6. The semiconductor package device of claim 5, wherein the interposer has a top surface and a bottom surface opposite to each other,
wherein the interposer further comprises pads on the top surface of the interposer and an adhesive layer on the bottom surface of the interposer, and
wherein some of the pads overlap with the connection terminals in the direction perpendicular to the top surface of the first package substrate.

7. The semiconductor package device of claim 5, wherein the molding member comprises a groove and a hole,
wherein the warpage prevention member is in the groove,
wherein each of the connection terminals is in the hole, and
wherein a depth of the hole is greater than a depth of the groove.

8. The semiconductor package device of claim 7, wherein a portion of the molding member is interposed between the warpage prevention member and the interposer.

9. A semiconductor package device, comprising:
a first package substrate;
a first semiconductor chip on the first package substrate;
an interposer on the first semiconductor chip;
a warpage prevention member on the interposer, the interposer being between the warpage prevention member and the first semiconductor chip;
a molding member on the interposer and the first package substrate; and
a second package substrate on the molding member,
wherein at least a portion of a top surface of the molding member is spaced apart from a bottom surface of the second package substrate.

10. The semiconductor package device of claim 9, wherein a thermal expansion coefficient of the warpage prevention member is greater than a thermal expansion coefficient of the interposer.

11. The semiconductor package device of claim 9, wherein a thermal conductivity of the warpage prevention member is greater than a thermal conductivity of the interposer.

12. The semiconductor package device of claim 9, wherein a level of a top surface of the warpage prevention member is equal to or higher than a level of the top surface of the molding member relative to a top surface of the first package substrate being a baseline level.

13. The semiconductor package device of claim 9, wherein at least a portion of a side surface of the warpage prevention member is free of the molding member.

14. The semiconductor package device of claim 9, further comprising a second semiconductor chip on the second package substrate,
wherein a thickness of the first package substrate is greater than a thickness of the second package substrate in a direction perpendicular to the top surface of the first package substrate.

15. The semiconductor package device of claim 14, wherein the interposer comprises a first pad, a second pad, and a redistribution pattern electrically connecting the first and second pads to each other, and
wherein the second pad is electrically connected to the first package substrate through a wire line.

16. The semiconductor package device of claim 15, further comprising a connection terminal connected to the first pad,
wherein a first thickness of the connection terminal is greater than a thickness of the warpage prevention member in the direction perpendicular to the top surface of the first package substrate, and a difference between the first thickness of the connection terminal and the thickness of the warpage prevention member is less than or equal to 30 μm.

17. The semiconductor package device of claim 9, wherein the warpage prevention member comprises copper or silicon pile.

18. The semiconductor package device of claim 17, wherein a thickness of the warpage prevention member is greater than a thickness of the interposer in a direction perpendicular to a top surface of the first package substrate having the first semiconductor chip thereon.

19. The semiconductor package device of claim 18, wherein a width of the warpage prevention member is less than a width of the interposer in a direction parallel to the top surface of the first package substrate.

20. The semiconductor package device of claim 19, wherein a thickness of the warpage prevention member is in a range from 100 μm to 150 μm.

* * * * *